(12) United States Patent
Park et al.

(10) Patent No.: US 8,259,591 B2
(45) Date of Patent: Sep. 4, 2012

(54) APPARATUS AND METHOD FOR RECEIVING SIGNAL IN A COMMUNICATION SYSTEM

(75) Inventors: Sung-Eun Park, Seoul (KR);
Dong-Seek Park, Yongin-si (KR);
Jae-Yeol Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1254 days.

(21) Appl. No.: 12/012,127

(22) Filed: Jan. 30, 2008

(65) Prior Publication Data

US 2008/0212549 A1 Sep. 4, 2008

(30) Foreign Application Priority Data

Jan. 30, 2007 (KR) .................... 10-2007-0009472

(51) Int. Cl.
*H04L 1/00* (2006.01)
(52) U.S. Cl. ...................... 370/242; 370/342
(58) Field of Classification Search .................... 370/342
See application file for complete search history.

(56) References Cited

U.S. PATENT DOCUMENTS

| | | | |
|---|---|---|---|
| 7,178,081 B2 | 2/2007 | Lee et al. | |
| 7,415,079 B2* | 8/2008 | Cameron et al. | 375/340 |
| 7,603,607 B2 | 10/2009 | Maehata | |
| 7,644,339 B2* | 1/2010 | Tran et al. | 714/758 |
| 2002/0034269 A1* | 3/2002 | Demjanenko et al. | 375/341 |
| 2003/0203721 A1* | 10/2003 | Berezdivin et al. | 455/126 |
| 2004/0098659 A1* | 5/2004 | Bjerke et al. | 714/776 |
| 2005/0138519 A1* | 6/2005 | Boutillon et al. | 714/752 |
| 2005/0149840 A1* | 7/2005 | Lee et al. | 714/800 |
| 2005/0210366 A1* | 9/2005 | Maehata | 714/794 |
| 2005/0240647 A1* | 10/2005 | Banihashemi et al. | 708/800 |
| 2007/0168832 A1* | 7/2007 | Richardson et al. | 714/758 |
| 2007/0245217 A1* | 10/2007 | Valle | 714/758 |
| 2008/0028282 A1* | 1/2008 | Zhong et al. | 714/794 |
| 2008/0065956 A1* | 3/2008 | Blankenship et al. | 714/758 |
| 2008/0126908 A1* | 5/2008 | Lin | 714/758 |
| 2009/0132887 A1* | 5/2009 | Matsumoto et al. | 714/752 |
| 2010/0153810 A1* | 6/2010 | Kamiya | 714/752 |

FOREIGN PATENT DOCUMENTS

| | | |
|---|---|---|
| KR | 10 2004 0056972 A | 7/2004 |
| KR | 10 2006 0044395 | 5/2006 |

\* cited by examiner

*Primary Examiner* — Bunjob Jaroenchonwanit

(57) ABSTRACT

A signal reception method and apparatus for a communication system. One input unit and $d_c-1$ delay nodes each receive one input message. A comparison unit compares magnitudes of the input messages being input to the $d_c-1$ delay nodes, and outputs an input message having a minimum magnitude as an output message. After the comparison unit outputs the output message, a controller cyclic-shifts the input messages being input to the one input unit and the $d_c-1$ delay nodes according to a control signal.

20 Claims, 4 Drawing Sheets

APPARATUS AND METHOD FOR RECEIVING SIGNAL IN A COMMUNICATION SYSTEM

CROSS-REFERENCE TO RELATED APPLICATION(S) AND CLAIM OF PRIORITY

This application claims the benefit under 35 U.S.C. §119 (a) of a Korean Patent Application filed in the Korean Intellectual Property Office on Jan. 30, 2007 and assigned Serial No. 2007-9472, the disclosure of which is incorporated herein by reference.

TECHNICAL FIELD OF THE INVENTION

The present invention relates generally to a communication system, and in particular, to an apparatus and method for receiving signals in a communication system.

BACKGROUND OF THE INVENTION

The next generation communication system has developed into a packet service communication system. The packet service communication system, a system (e.g., one or more base stations) for transmitting burst packet data to multiple mobile stations, has been designed to be suitable for high-capacity data transmission. The next generation communication system considers using, as channel codes, not only the turbo codes but also the Low Density Parity Check (LDPC) codes, which are known to have good performance gain for high-speed data transmission and can increase reliability of data transmission by effectively correcting errors caused by the noises generated in a transmission channel. The next generation communication system, considering using the LDPC codes, includes an Institute of Electrical and Electronics Engineers (IEEE) 802.16e communication system and an IEEE 802.11n communication system.

With reference to FIG. 1, a description will now be made of a structure of a signal transmission apparatus in a general communication system using LDPC codes.

FIG. 1 illustrates a structure of a signal transmission apparatus (e.g., a base station) in a general communication system using LDPC codes.

Referring to FIG. 1, the signal transmission apparatus includes an encoder 111, a modulator 113, and a transmitter 115. The information data (or information vector, $\underline{s}$) that the signal transmission apparatus intends to transmit, is delivered to the encoder 111. The encoder 111 encodes the information vector $\underline{s}$ with a predetermined encoding scheme to generate a codeword vector $\underline{c}$, or LDPC codeword, and outputs the codeword vector $\underline{c}$ to the modulator 113. The encoding scheme is herein an LDPC encoding scheme. The modulator 113 modulates the codeword vector $\underline{c}$ with a predetermined modulation scheme to generate a modulation vector $\underline{m}$, and outputs the modulation vector $\underline{m}$ to the transmitter 115. The transmitter 115 performs transmission signal processing on the modulation vector $\underline{m}$ output from the modulator 113, and transmits the resulting signal to a signal reception apparatus via an antenna ANT.

Next, with reference to FIG. 2, a description will be made of a structure of a signal reception apparatus in a general communication system using LDPC codes.

FIG. 2 illustrates a structure of a signal reception apparatus (e.g., a mobile station) in a general communication system using LDPC codes.

Referring to FIG. 2, the signal reception apparatus includes a receiver 211, a demodulator 213, and a decoder 215. The signal transmitted by the signal transmission apparatus is received at the signal reception apparatus via an antenna ANT, and the received signal is delivered to the receiver 211. The receiver 211 performs reception signal processing on the received signal to generate a received vector $\underline{r}$, and outputs the received vector $\underline{r}$ to the demodulator 213. The demodulator 213 demodulates the received vector $\underline{r}$ output from the receiver 211 with a demodulation scheme corresponding to the modulation scheme used in the modulator 113 of the signal transmission apparatus, and outputs the resulting demodulation vector $\underline{x}$ to the decoder 215. The decoder 215 decodes the demodulation vector $\underline{x}$ output from the demodulator 213 with a decoding scheme corresponding to the encoding scheme used in the encoder 111 of the signal transmission apparatus, and outputs the decoded signal as the finally restored information vector $\underline{\hat{s}}$. Herein, an iterative decoding algorithm based on a sum-product algorithm or a min-sum algorithm is popularly used for the decoding scheme, or LDPC decoding scheme, and a detailed description of the sum-product algorithm and the min-sum algorithm will be given below.

The LDPC code is a code defined by a parity check matrix in which major elements have a value of '0' and minor elements except for the elements having a value of '0' have a non-zero value, for example, a value of '1'. The LDPC code can be expressed with a bipartite graph, and the bipartite graph is a graph expressed with variable nodes, check nodes, and edges connecting the variable nodes to the check nodes.

The LDPC code can be decoded using the sum-product algorithm-based iterative decoding algorithm in the bipartite graph. The sum-product algorithm is a kind of a message passing algorithm, and the 'message passing algorithm' refers to an algorithm for exchanging messages over edges in the bipartite graph, and calculating and updating output messages from the messages being input to the variable nodes or check nodes. Therefore, a decoder for decoding the LDPC code, it uses the message passing algorithm-based iterative decoding algorithm, has lower complexity and can be easily realized with a parallel-processing decoder, compared with the decoder for the turbo code.

Next, with reference to FIG. 3, a description will be made of a message passing operation in an arbitrary check node of a decoder using a general LDPC decoding scheme (hereinafter referred to as an 'LDPC decoder').

FIG. 3 illustrates a message passing operation in an arbitrary check node of a general LDPC decoder.

In FIG. 3, there are included a check node m 300 and multiple variable nodes 310, 320, 330 and 340 connected to the check node m 300. Further, $T_{n',m}$ indicates a message passed (or transferred) from the variable node n' 310 to the check node m 300, and $E_{n,m}$ indicates a message passed from the check node m 300 to the variable node n 330. Herein, a set of all variable nodes connected to the check node m 300 is defined as N(m), and a set given by excluding the variable node n 330 from N(m) is defined as N(m)\n. In this case, a message update rule based on the sum-product algorithm can be expressed as Equation 1:

$$\text{Sign}(E_{n,m}) = \prod_{n' \in N(m) \setminus n} \text{Sign}(T_{n',m}) \qquad [\text{Eqn. 1}]$$

$$|E_{n,m}| = \Phi\left[\sum_{n' \in N(m) \setminus n} \Phi(|T_{n',m}|)\right]$$

In Equation 1, $\text{Sign}(E_{n,m})$ denotes a sign of a message $E_{n,m}$, $|E_{n,m}|$ denotes an magnitude of a message $E_{n,m}$, and a function $\Phi(x)$ can be expressed as Equation 2:

$$\Phi(x) = -\log\left[\tanh\left(\frac{x}{2}\right)\right] \qquad [\text{Eqn. 2}]$$

A message update rule based on the min-sum algorithm can be expressed as Equation 3:

$$\text{Sign}(E_{n,m}) = \prod_{n' \in N(m) \setminus n} \text{Sign}(T_{n',m}) \qquad [\text{Eqn. 3}]$$

$$|E_{n,m}| = \min_{n' \in N(m) \setminus n}\{|T_{n',m}|\} = |T_{n_0,m}|$$

In Equation 3, $n_0$ can be rewritten as Equation 4:

$$n_0 \, \underset{n' \in N(m) \setminus n}{\text{Argmin}}\{|T_{n',m}|\} \qquad [\text{Eqn. 4}]$$

Although an input/output message of each node is used without an absolute sign of Equation 1, Equation 3 or Equation 4, a magnitude of the message can be expressed.

Next, with reference to FIG. 4, a description will be made of an input/output message passing operation in an arbitrary check node of an LDPC code generated in a general LDPC decoder.

FIG. 4 illustrates an internal structure of a general LDPC decoder.

Referring to FIG. 4, a description will be made of an input/output message passing operation for a check node. A check node operator of the LDPC decoder includes a first memory 400, a check node processor 410, and a second memory 420. The first memory 400 stores the messages to be input to the check node processor 410. The second memory 420 stores the messages output from the check node processor 410. Further, the first memory 400 includes a plurality of, for example, $d_c$ sub-memories, i.e., a sub-memory #1 $T_{n_1,m}$ (400-1) to a sub-memory

$d_c$ $T_{n_{d_c},m}$ (400-$d_c$).

The second memory 420 includes a plurality of, for example, $d_c$ sub-memories, i.e., a sub-memory #1 $E_{n_1,m}$ (420-1) to a sub-memory

$d_c$ $E_{n_{d_c},m}$ (420-$d_c$).

If an input degree of the check node processor 410 is assumed to be $d_c$, the $d_c$ input messages are stored in the sub-memory #1 $T_{n_1,m}$ (400-1) to the sub-memory

$d_c$ $T_{n_{d_c},m}$ (400-$d_c$), and output messages associated with the $d_c$ input messages are stored in the sub-memory #1 $E_{n_1,m}$ (420-1) to the sub-memory

$d_c$ $E_{n_{d_c},m}$ (420-$d_c$).

As described above, the check node processor 410 performs the message passing operation based on the min-sum algorithm using Equation (3). That is, the check node's output messages $E_{n_1,m}$ (420-1), $E_{n_2,m}$ (420-2), $E_{n_3,m}$ (420-3) and $E_{n_{d_c},m}$ (420-$d_c$)

are calculated using Equation (3). The output message $E_{n_1,m}$ (420-1) is calculated using the remaining $d_c-1$ messages except for the input message $T_{n_1,m}$ (400-1) among the $d_c$ input messages $T_{n_1,m}$ (400-1), $T_{n_2,m}$ (400-2), $T_{n_3,m}$ (400-3) and $T_{n_{d_c},m}$ (400-$d_c$).

The output message $E_{n_2,m}$ (420-2) is calculated using the remaining $d_c-1$ messages except for the input message $T_{n_2,m}$ (400-2) among the $d_c$ input messages $T_{n_1,m}$ (400-1), $T_{n_2,m}$ (400-2), $T_{n_3,m}$ (400-3) and $T_{n_{d_c},m}$ (400-$d_c$).

The output message $E_{n_3,m}$ (420-3) is calculated using the remaining $d_c-1$ messages except for the input message $T_{n_3,m}$ (400-3) among the $d_c$ input messages $T_{n_1,m}$ (400-1), $T_{n_2,m}$ (400-2), $T_{n_3,m}$ (400-3) and $T_{n_{d_c},m}$ (400-$d_c$).

The output messages $E_{n_1,m}$ (420-1), $E_{n_2,m}$ (420-2), $E_{n_3,m}$ (402-3) and $E_{n_{d_c},m}$ (420-$d_c$)

calculated by Equation (3) in this manner are input to $d_c$ variable nodes $n_1, n_2, n_3, \ldots, n_{d_c}$, respectively.

Table 1 shows input/output values of the messages, obtained when an operation of a $d_c=9$ check node is performed using the min-sum algorithm.

TABLE 1

| i | $T_{n_1,m}$ | $T_{n_2,m}$ | $T_{n_3,m}$ | $T_{n_4,m}$ | $T_{n_5,m}$ | $T_{n_6,m}$ | $T_{n_7,m}$ | $T_{n_8,m}$ | $T_{n_9,m}$ | $E_{n_1,m}$ |
|---|---|---|---|---|---|---|---|---|---|---|
| 1 | 3 | 7 | 2 | 9 | 1 | 5 | 3 | 6 | 4 | 1 |
| 2 | 3 | 7 | 2 | 9 | 1 | 5 | 3 | 6 | 4 | 1 |
| 3 | 3 | 7 | 2 | 9 | 1 | 5 | 3 | 6 | 4 | 1 |
| 4 | 3 | 7 | 2 | 9 | 1 | 5 | 3 | 6 | 4 | 1 |
| 5 | 3 | 7 | 2 | 9 | 1 | 5 | 3 | 6 | 4 | 2 |
| 6 | 3 | 7 | 2 | 9 | 1 | 5 | 3 | 6 | 4 | 1 |
| 7 | 3 | 7 | 2 | 9 | 1 | 5 | 3 | 6 | 4 | 1 |
| 8 | 3 | 7 | 2 | 9 | 1 | 5 | 3 | 6 | 4 | 1 |
| 9 | 3 | 7 | 2 | 9 | 1 | 5 | 3 | 6 | 4 | 1 |

In Table 1, values of the $d_c=9$ messages being input to the check node m are $T_{n_1,m}=3$, $T_{n_2,m}=7$, $T_{n_3,m}=2$, $T_{n_4,m}=9$, $T_{n_6,m}=1$, $T_{n_6,m}=5$, $T_{n_7,m}=3$, $T_{n_8,m}=6$, and $T_{n_9,m}=4$, respectively. The message $E_{n_1,m}$ output from the check node processor 410 can be calculated using the remaining 8 messages except for the input message $T_{n_1,m}$ among the 9 input messages. If the min-sum algorithm is used, because the minimum value among the values of the remaining 8 messages is $T_{n_5,m}=1$, $E_{n_1,m}$ is 1 ($E_{n_1,m}=1$). In this manner, values of the output messages $E_{n_1,m}$ (420-1) to $$E_{n_{d_c},m} \quad (420\text{-}d_c)$$

can be calculated.

As described above, when the check node processor performs the operation using the min-sum algorithm, it needs many operations to calculate the output messages, considerably increasing the complexity. Therefore, there is a need for a check node processor for reducing the complexity when performing the operation of the check node using the min-sum algorithm.

SUMMARY OF THE INVENTION

To address the above-discussed deficiencies of the prior art, it is a primary object of the present invention to address at least the problems and/or disadvantages and to provide at least the advantages described below. Accordingly, an aspect of the present invention is to provide an apparatus and method for receiving signals in a communication system using an LDPC code.

Another aspect of the present invention is to provide an apparatus and a method for receiving signals with low complexity in a communication system using an LDPC code.

Another aspect of the present invention is to provide an apparatus and a method for receiving signals by performing a check node operation, the complexity of which is minimized using the min-sum algorithm, in a communication system using an LDPC code.

According to one aspect of the present invention, there is provided a method for receiving a signal in a signal reception apparatus of a communication system. The signal reception method includes applying one input message to each of one input unit and $d_c-1$ delay nodes; comparing magnitudes of the input messages being input to the $d_c-1$ delay nodes, and outputting an input message having a minimum magnitude as an output message; after outputting the output message, cyclic-shifting the input messages being input to the one input unit and the $d_c-1$ delay nodes according to a control signal; and repeatedly performing the foregoing steps $d_c$ times.

According to another aspect of the present invention, there is provided a signal reception apparatus of a communication system. The signal reception apparatus includes one input unit and $d_c-1$ delay nodes, each of which receives one input message; a comparison unit for comparing magnitudes of the input messages being input to the $d_c-1$ delay nodes, and outputting an input message having a minimum magnitude as an output message; and a controller for, after the comparison unit outputs the output message, cyclic-shifting the input messages being input to the one input unit and the $d_c-1$ delay nodes according to a control signal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication systems.

According to the present invention, an arbitrary check node performs a check node operation (or check node computation) using a min-sum algorithm to output messages to all variable nodes connected to the check node in a communication system using a Low Density Parity Check (LDPC) code. The present invention provides a signal reception apparatus and method for performing a check node operation based on the min-sum algorithm using a delay line and comparators to minimize the complexity, and efficiently calculating output messages to decode the LDPC code.

Figure 1:
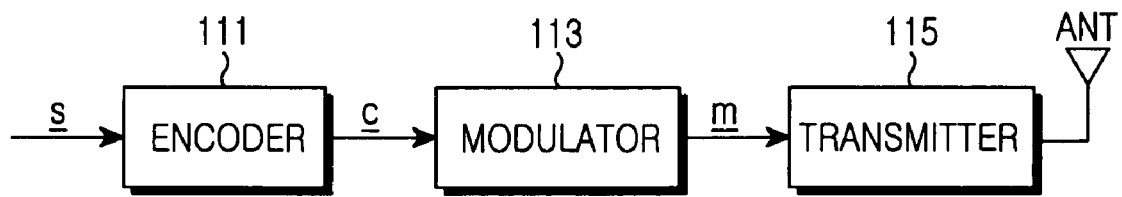
FIG. 1, illustrates a structure of a signal transmission apparatus in a general communication system using LDPC codes.
Figure 2:
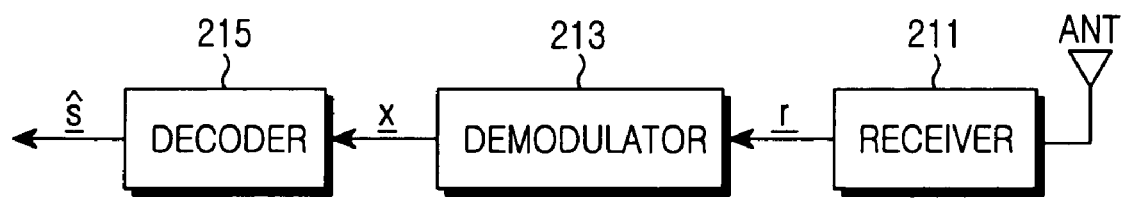
FIG. 2 illustrates a structure of a signal reception apparatus in a general communication system using LDPC codes.
Figure 3:
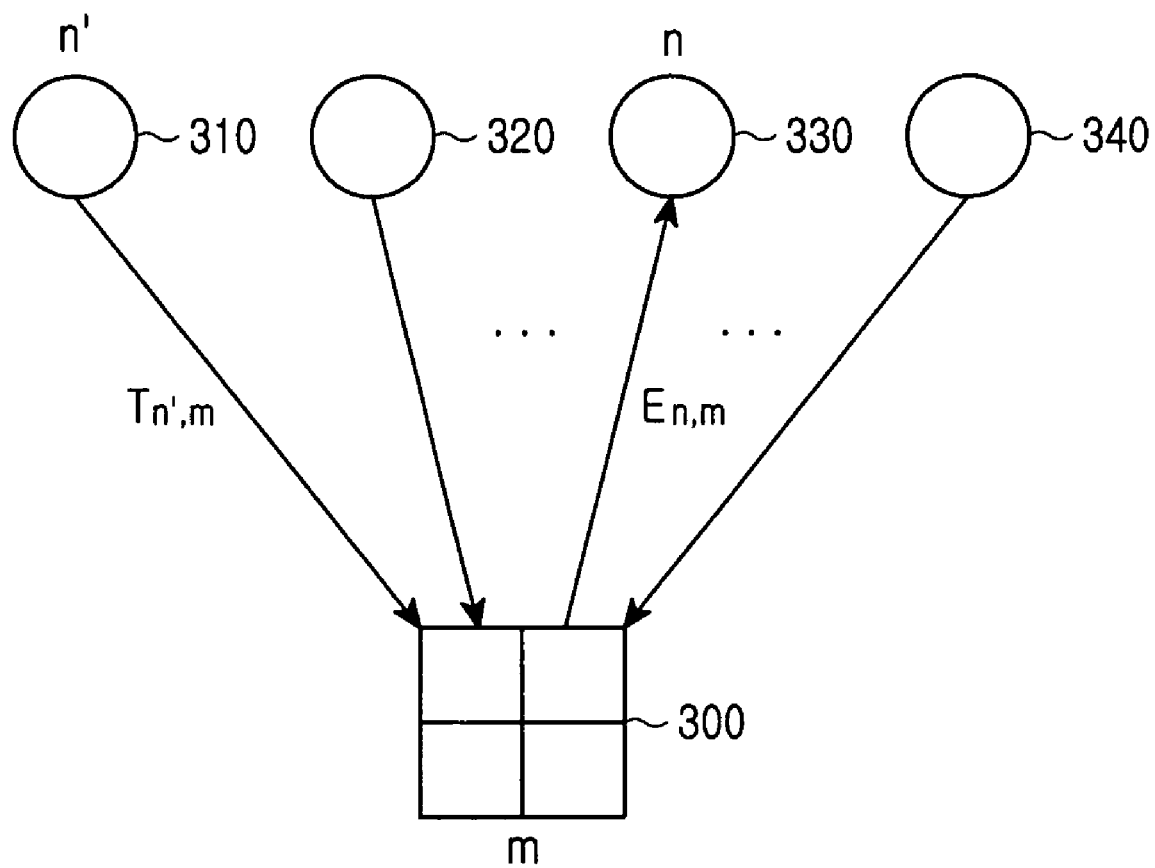
FIG. 3 illustrates a message passing operation in an arbitrary check node of a general LDPC decoder.
Figure 4:
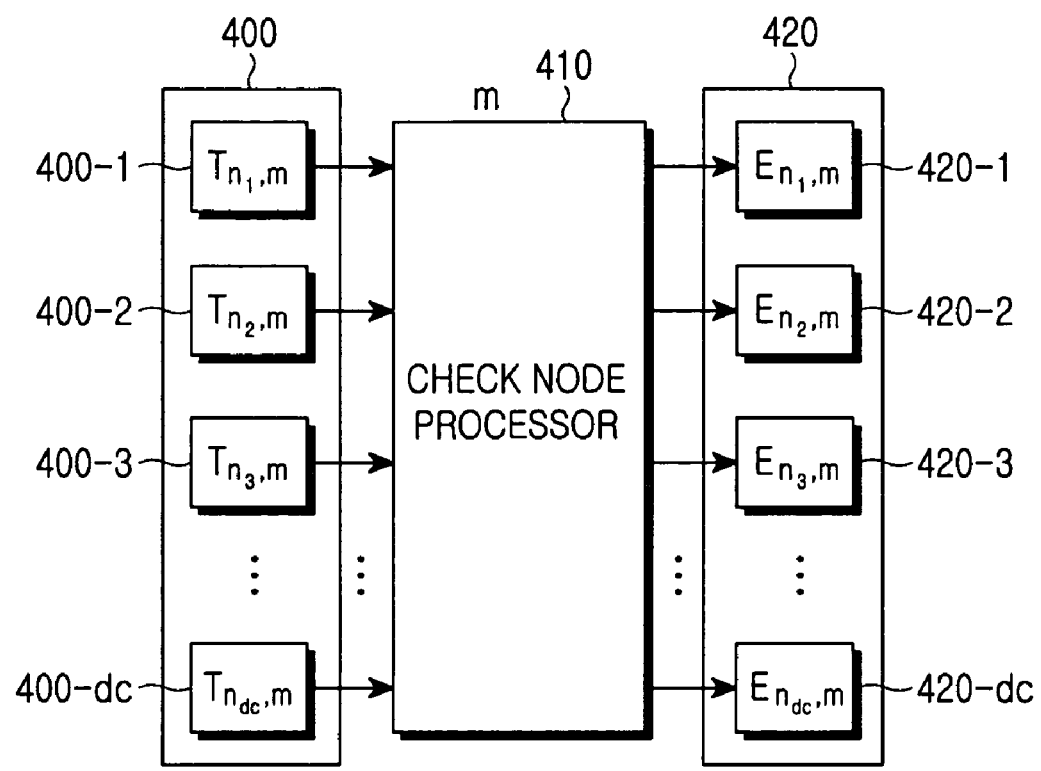
FIG. 4 illustrates an internal structure of a general LDPC decoder.
Figure 5:
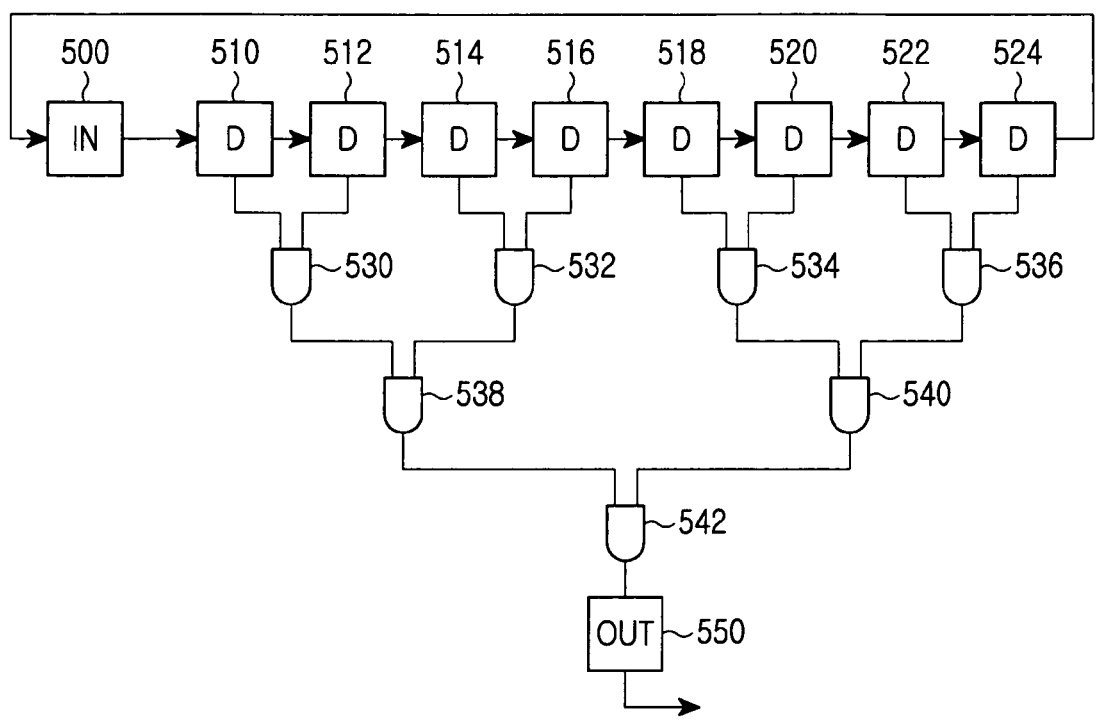
FIG. 5 schematically illustrates a check node operator that uses a delay line and comparators in an arbitrary check node of an LDPC code according to an embodiment of the present invention.

With reference to FIG. 5, a description will now be made of a check node operator that performs a check node operation in an arbitrary check node of an LDPC code using a delay line and comparators according to an embodiment of the present invention.

FIG. 5 schematically illustrates a check node operator that uses a delay line and comparators in an arbitrary check node of an LDPC code according to an embodiment of the present invention.

Referring to FIG. 5, the check node operator includes an input unit 500; a delay line including multiple delay nodes 510, 512, 514, 516, 518, 520, 522 and 524; a comparison unit including comparators 530, 532, 534, 536, 538, 540 and 542; and an output unit 550. It will be assumed herein that the check node operator includes $d_c$ input messages, $d_c-1$ delay nodes, and $d_c-2$ comparators. Although not illustrated in the drawing, the check node operator is assumed to include a controller for cyclic-shifting the input unit and the delay nodes.

The comparators 530, 532, 534, 536, 538, 540 and 542 each perform the function of outputting a smaller one of the two input values. Table 2 and Table 3 show the values being input or output to/from the delay line and the comparators, obtained when an operation of a $d_c=9$ check node is performed using the min-sum algorithm.

TABLE 2

| IN | Delay Line | | | | | | | |
|---|---|---|---|---|---|---|---|---|
| 500 | 510 | 512 | 514 | 516 | 518 | 520 | 522 | 524 |
| $T_1=3$ | $T_9=4$ | $T_8=6$ | $T_7=3$ | $T_6=5$ | $T_5=1$ | $T_4=9$ | $T_3=2$ | $T_2=7$ |
| $T_2=7$ | $T_1=3$ | $T_9=4$ | $T_8=6$ | $T_7=3$ | $T_6=5$ | $T_5=1$ | $T_4=9$ | $T_3=2$ |
| $T_3=2$ | $T_2=7$ | $T_1=3$ | $T_9=4$ | $T_8=6$ | $T_7=3$ | $T_6=5$ | $T_5=1$ | $T_4=9$ |
| $T_4=9$ | $T_3=2$ | $T_2=7$ | $T_1=3$ | $T_9=4$ | $T_8=6$ | $T_7=3$ | $T_6=5$ | $T_5=1$ |
| $T_5=1$ | $T_4=9$ | $T_3=2$ | $T_2=7$ | $T_1=3$ | $T_9=4$ | $T_8=6$ | $T_7=3$ | $T_6=5$ |
| $T_6=5$ | $T_5=1$ | $T_4=9$ | $T_3=2$ | $T_2=7$ | $T_1=3$ | $T_9=4$ | $T_8=6$ | $T_7=3$ |
| $T_7=3$ | $T_6=5$ | $T_5=1$ | $T_4=9$ | $T_3=2$ | $T_2=7$ | $T_1=3$ | $T_9=4$ | $T_8=6$ |
| $T_8=6$ | $T_7=3$ | $T_6=5$ | $T_5=1$ | $T_4=9$ | $T_3=2$ | $T_2=7$ | $T_1=3$ | $T_9=4$ |
| $T_9=4$ | $T_8=6$ | $T_7=3$ | $T_6=5$ | $T_5=1$ | $T_4=9$ | $T_3=2$ | $T_2=7$ | $T_1=3$ |

TABLE 3

| Comparator | | | | | | | OUT |
|---|---|---|---|---|---|---|---|
| 530 | 532 | 534 | 536 | 538 | 540 | 542 | 550 |
| 4 | 3 | 1 | 2 | 3 | 1 | 1 | $E_1=1$ |
| 3 | 3 | 1 | 2 | 3 | 1 | 1 | $E_2=1$ |
| 3 | 4 | 3 | 1 | 3 | 1 | 1 | $E_3=1$ |
| 2 | 3 | 3 | 1 | 2 | 1 | 1 | $E_4=1$ |
| 2 | 3 | 4 | 3 | 2 | 3 | 2 | $E_5=2$ |
| 1 | 2 | 3 | 3 | 1 | 3 | 1 | $E_6=1$ |
| 1 | 2 | 3 | 4 | 1 | 3 | 1 | $E_7=1$ |
| 3 | 1 | 2 | 3 | 1 | 2 | 1 | $E_8=1$ |
| 3 | 1 | 2 | 3 | 1 | 2 | 1 | $E_9=1$ |

When the check node operation is started, $T_1$ is input to the input unit 500, $T_9$ is input to the delay node 510, $T_8$ is input to the delay node 512, $T_7$ is input to the delay node 514, $T_6$ is input to the delay node 516, $T_5$ is input to the delay node 518, $T_4$4 is input to the delay node 520, $T_3$ is input to the delay node 522, and $T_2$ is input to the delay node 524.

The comparator 530 compares the values input to the delay node 510 and the delay node 512, and outputs a smaller value. The comparator 532 compares the values input to the delay node 514 and the delay node 516, and outputs a smaller value. The comparator 534 compares the values input to the delay node 518 and the delay node 520, and outputs a smaller value. The comparator 536 compares the values input to delay node 522 and the delay node 524, and outputs a smaller value.

The comparator 538 compares the value output from the comparator 530 with the value output from the comparator 532, and outputs a smaller value. The comparator 540 compares the value output from the comparator 534 with the value output from the comparator 536, and outputs a smaller value. The comparator 524 compares the value output from the comparator 538 with the value output from the comparator 540, and outputs a smaller value.

As described above, the check node operator (or controller) acquires an output value $E_1$ by performing the comparison operation on the values input to the delay nodes.

Next, to acquire $E_2$, the controller right-shifts the input unit 500 and the delay nodes 510, 512, 514, 516, 518, 520, 522 and 524 on a one-by-one basis. That is, $T_2$ is input to the input unit 500, $T_1$ is input to the delay node 510, $T_9$ is input to the delay node 512, $T_8$ is input to the delay node 514, $T_7$ is input to the delay node 516, $T_6$ is input to the delay node 518, $T_5$ is input to the delay node 520, $T_4$ is input to the delay node 522, and $T_3$ is input to the delay node 524.

The controller can acquire the $E_2$ in the above-described manner of acquiring the $E_1$ from the input values using the comparators. Similarly, the controller can acquire the output values $E_3$ to $E_9$ by applying the above-described method to the $E_1$ and $E_2$.

As is apparent from the foregoing description, in the communication system using an LDPC code, the present invention decodes the LDPC code using the min-sum algorithm to output messages to variable nodes in an arbitrary check node, and reduces the complexity with the use of the delay line and the comparators, thereby facilitating the efficient decoding.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for receiving a signal in a signal reception apparatus of a communication system, the method comprising:
receiving a specified number, $d_c$, of input messages at a check node operator, wherein $d_c$ is a finite number; and
generating $d_c$ output messages by, for each output message:
inputting a corresponding one of the input messages to an input unit of the check node operator,
inputting each of a remaining set of $d_c-1$ input messages to a corresponding delay node of the check node operator,
comparing magnitudes of the remaining set of input messages input to the delay nodes with comparators of the check node operator,
outputting from the comparators the output message, wherein the output message comprises a minimum magnitude of the remaining set of input messages, and
cyclic-shifting the input messages being input to the input unit and to the delay nodes with a controller according to a control signal to generate a subsequent output message until $d_c$ output messages are generated.

2. The method of claim 1, wherein $d_c$ indicates a number of variable nodes connected to a check node corresponding to the check node operator.

3. The method of claim 2, wherein the communication system uses Low Density Parity Check (LDPC) codes.

4. The method of claim 3, wherein the communication system is configured to decode the LDPC code using a min-max algorithm.

5. A signal reception apparatus of a communication system, the apparatus comprising:
a check node operator configured to receive a specified number, $d_c$, of input messages and to generate $d_c$ output messages based on the input messages, wherein $d_c$ is a finite number, and wherein the check node operator comprises:
an input unit configured to receive a corresponding one of the input messages,
$d_c-1$ delay nodes, each of the delay nodes configured to receive one of a remaining set of $d_c-1$ input messages,
$d_c-2$ comparators, wherein the comparators are configured to compare magnitudes of the remaining set of input messages received by the delay nodes and to output an output message, wherein the output message comprises a minimum magnitude of the remaining set of input messages, and
a controller configured to cyclic-shift the input messages received by the input unit and the delay nodes according to a control signal to generate a subsequent output message.

6. The apparatus of claim 5, wherein $d_c$ indicates a number of variable nodes connected to a check node corresponding to the check node operator.

7. The apparatus of claim 5, wherein the communication system uses Low Density Parity Check (LDPC) codes.

8. The apparatus of claim 7, wherein the communication system is configured to decode the LDPC code using a min-max algorithm.

9. A signal reception apparatus of a wireless network, comprising:
a delay line configured to receive $d_c-1$ of input messages, wherein $d_c$ is a finite number;
a comparison unit coupled to the delay line, wherein the comparison unit is configured to compare magnitudes of the input messages received by the delay line and to output an output message, wherein the output message comprises a minimum magnitude of the input messages received by the delay line; and
a controller configured to, after the comparison unit outputs the output message, cyclic-shift the $d_c$ input messages according to a control signal to generate a subsequent output message.

10. The apparatus of claim 9, wherein $d_c$ indicates a number of variable nodes connected to a check node corresponding to the apparatus.

11. The apparatus of claim 9, further comprising an input unit coupled to the delay line, wherein the input unit is configured to receive a remaining one of the input messages other than the input messages received by the delay line.

12. The apparatus of claim 9, wherein the wireless network uses Low Density Parity Check (LDPC) codes.

13. The apparatus of claim 12, wherein the wireless network is configured to decode the LDPC code using a min-max algorithm.

14. A signal reception apparatus of a wireless network, comprising:
a check node operator configured to receive a specified number, $d_c$, of input messages and to generate output messages based on the input messages, wherein $d_c$ is a finite number, and wherein the check node operator comprises:
an input unit configured to receive a corresponding one of the input messages;
$d_c-1$ delay nodes, each of the delay nodes configured to receive one of a remaining set of $d_c-1$ input messages;
a comparison unit coupled to the delay nodes, wherein the comparison unit is configured to compare magnitudes of the remaining set of input messages received by the delay nodes and to output an output message, wherein the output message comprises a minimum magnitude of the remaining set of input messages; and
a controller configured to, after the comparison unit outputs the output message, cyclic-shift the input messages received by the input unit and the delay nodes according to a control signal to generate a subsequent output message.

15. The apparatus of claim 14, wherein $d_c$ indicates a number of variable nodes connected to a check node corresponding to the check node operator.

16. The apparatus of claim 14, wherein the wireless network uses Low Density Parity Check (LDPC) codes.

17. The apparatus of claim 16, wherein the wireless network is configured to decode the LDPC code using a min-max algorithm.

18. The apparatus of claim 5, wherein the check node operator further comprises an output unit coupled to the comparators, wherein the output unit is configured to receive the output message from the comparators and to provide the output message as an output of the check node operator.

19. The apparatus of claim 9, further comprising an output unit coupled to the comparison unit, wherein the output unit is configured to receive the output message from the comparison unit and to provide the output message as an output of the apparatus.

20. The apparatus of claim 14, wherein the check node operator further comprises an output unit coupled to the comparison unit, wherein the output unit is configured to receive the output message from the comparison unit and to provide the output message as an output of the check node operator.

* * * * *